(12) United States Patent
Ryu (10) Patent No.: US 7,567,193 B2
(45) Date of Patent: Jul. 28, 2009

(54) CONTINUOUS TIME DELTA-SIGMA MODULATOR AND ELECTRONIC CIRCUIT INCLUDING THE SAME

(75) Inventor: Seung-Tak Ryu, Suwon-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 0 days.

(21) Appl. No.: 11/935,856

(22) Filed: Nov. 6, 2007

(65) Prior Publication Data

US 2008/0055141 A1 Mar. 6, 2008

(30) Foreign Application Priority Data

Nov. 7, 2006 (KR) ............ 10-2006-0109217

(51) Int. Cl.
*H03M 3/00* (2006.01)
(52) U.S. Cl. .................... 341/143; 341/144
(58) Field of Classification Search .......... 341/143, 341/118, 120, 155
See application file for complete search history.

(56) References Cited

U.S. PATENT DOCUMENTS

| | | | |
|---|---|---|---|
| 5,585,765 A * | 12/1996 | O'Shaughnessy | 331/111 |
| 5,654,708 A * | 8/1997 | Boehl et al. | 341/120 |
| 7,042,381 B1 | 5/2006 | Pan | |
| 7,142,143 B2 * | 11/2006 | Draxelmayr | 341/143 |
| 2006/0087300 A1 * | 4/2006 | Endo et al. | 323/282 |

FOREIGN PATENT DOCUMENTS

| | | |
|---|---|---|
| JP | 1989-164124 | 6/1989 |
| KR | 2004-016474 | 12/2004 |
| KR | 1020060006501 A | 1/2006 |

* cited by examiner

*Primary Examiner*—Rexford Barnie
*Assistant Examiner*—Joseph Lauture
(74) *Attorney, Agent, or Firm*—F. Chau & Assoc., LLC

(57) ABSTRACT

An electronic circuit includes a digital-to-analog converter (DAC), and an active integrator. The DAC converts a digital output of the electronic circuit to an analog signal and feeds back the analog signal. The active integrator includes an operational amplifier having a first input terminal that receives a summed signal of an input signal and the fed back analog signal, and a second input terminal that receives a reference voltage. The DAC includes a coupling capacitor, first switches, at least one current source, second switches, and a third switch.

21 Claims, 5 Drawing Sheets

CONTINUOUS TIME DELTA-SIGMA MODULATOR AND ELECTRONIC CIRCUIT INCLUDING THE SAME

CROSS-REFERENCE TO RELATED APPLICATION

This application claims priority under 35 USC § 119 to Korean Patent Application No. 2006-00109217, filed on Nov. 7, 2006 in the Korean Intellectual Property Office (KIPO), the disclosure of which is incorporated herein in its entirety by reference.

BACKGROUND OF THE INVENTION

1. Technical Field

The present disclosure relates to an electronic circuit having a digital-to analog conversion feedback loop and, more particularly, to a continuous time delta-sigma modulator (CTDSM) having a digital-to analog conversion feedback loop and an electronic circuit including the CTDSM.

2. Discussion of Related Art

A delta-sigma modulator (DSM) provides highly precise modulation with low noise, and is widely used in high-end audio systems, communication systems, and precise measuring devices.

Figure 1:
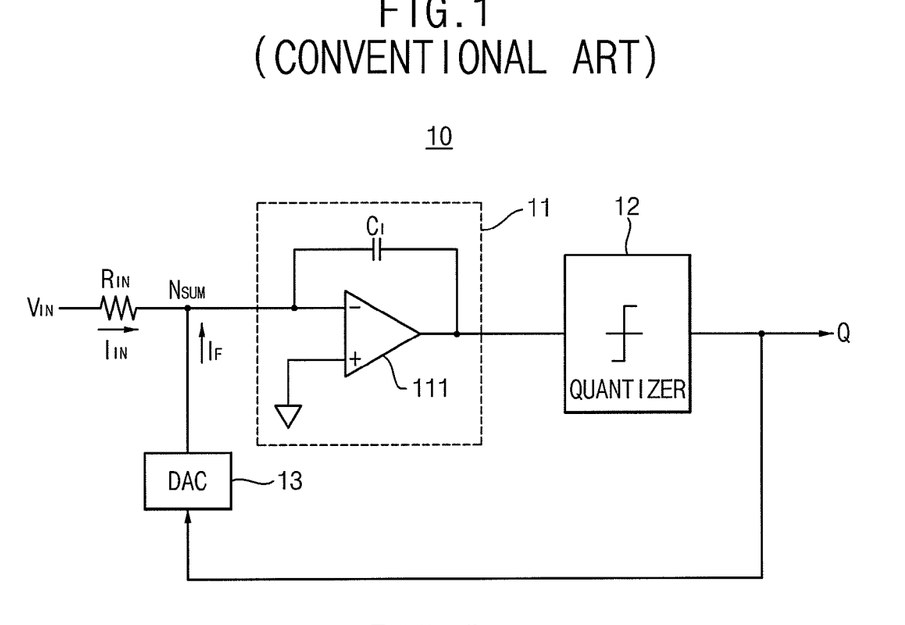
FIG. 1 is a block diagram illustrating architecture of a general DSM.

FIG. 1 is a block diagram illustrating architecture of a general DSM.

Referring to FIG. 1, the CTDSM 10 includes an integrator 11, a quantizer 12, and a feedback digital-to-analog converter (DAC) 13. Input signal $V_{IN}$ may be a single-ended signal, or the input signal $V_{IN}$ may be a differential signal. An input resistor $R_{IN}$ may be included in the input stage. Architecture of the CTDSM may be modified according to an order of the CTDSM or the kind of input signal $V_{IN}$.

A discrete time delta-sigma modulator (DTDSM) (not shown) has similar architecture to the CTDSM 10, and the DTDSM is widely used together with the CTDSM 10. An integrator (not shown) of the DTDSM receives a discrete input pulse, while the integrator 11 of the CTDSM 10 receives an analog input signal that continuously varies according to time.

The CTDSM 10 integrates the analog input signal and, thus, the CTDSM 10 may have less strict requirements, such as a settling time during which an output of an operational amplifier 111 in the integrator 11 is settled, than the DTDSM. In addition, the CTDSM 10 may not require an anti-aliasing filter, may be implemented with a lower order, and may consume less power compared with the DTDSM.

The integrator 11 integrates a sum of an input current $I_{IN}$ and an analog-converted feedback signal $I_F$. The input current $I_{IN}$ corresponds to the input signal $V_{IN}$ divided by the input resistor $R_{IN}$. The response characteristic of the CTDSM 10 is proportional to the linearity of the integrator 11. The integrator 11 is exemplified as an active RC configuration using the operational amplifier 111 and a capacitor $C_I$.

The quantizer 12 quantizes an output of the integrator 11 and provides the quantized output as a digital output Q. The feedback DAC 13 receives the digital output Q and converts the digital output Q to the analog feedback signal $I_F$. The analog-converted feedback signal $I_F$ is summed with the input current $I_{IN}$ at a summing node $N_{SUM}$, and the summed signal is applied to the integrator 11.

The feedback DAC 13 may be implemented with various configurations, and the basic object of the feedback DAC 13 is to provide the analog feedback current $I_F$ corresponding to the digital output Q of the quantizer 12 to the summing node $N_{SUM}$. The feedback DAC 13 may be implemented with a current DAC (I-DAC), or a switched capacitor DAC (SC-DAC). The I-DAC includes current sources, and provides analog current by combining outputs of the current sources. The SC-DAC includes current sources, switches, and a capacitor, and controls the analog current by providing charges, or being provided with charges, at every clock.

Figure 2A:
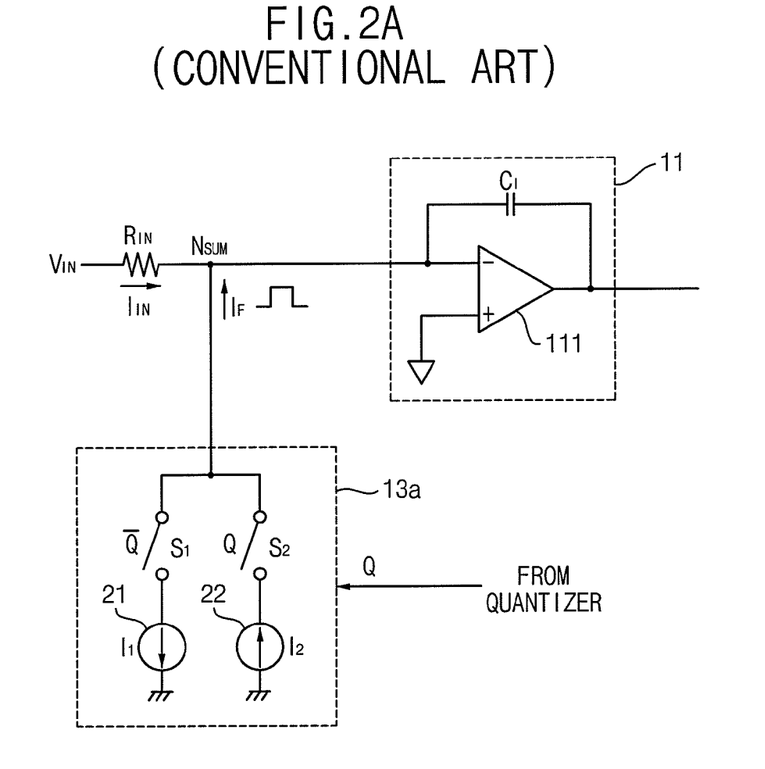
FIG. 2A and FIG. 2B are block diagrams respectively illustrating an I-DAC and an SC-DAC for use in an input part of the CTDSM shown in FIG. 1.

FIG. 2A is a block diagram illustrating the input part of the CTDSM in FIG. 1 in which the feedback DAC 13 in FIG. 1 is implemented with an I-DAC 13a. The input part includes the input resistor $R_{IN}$, the integrator 11, and the feedback DAC 13. The feedback DAC 13 in FIG. 1 is implemented with the I-DAC 13a in FIG. 2A.

Referring to FIG. 2A, the I-DAC 13a includes first and second current sources 21 and 22. The first and second current sources 21 and 22 are respectively connected to or disconnected from the summing node $N_{SUM}$ by first and second switches S1 and S2 in response to the digital output Q of the quantizer 12. The I-DAC 13a provides the feedback current $I_F$ to the summing node $N_{SUM}$ during one cycle or a half cycle of the digital output Q according to the digital output Q.

Figure 2B:
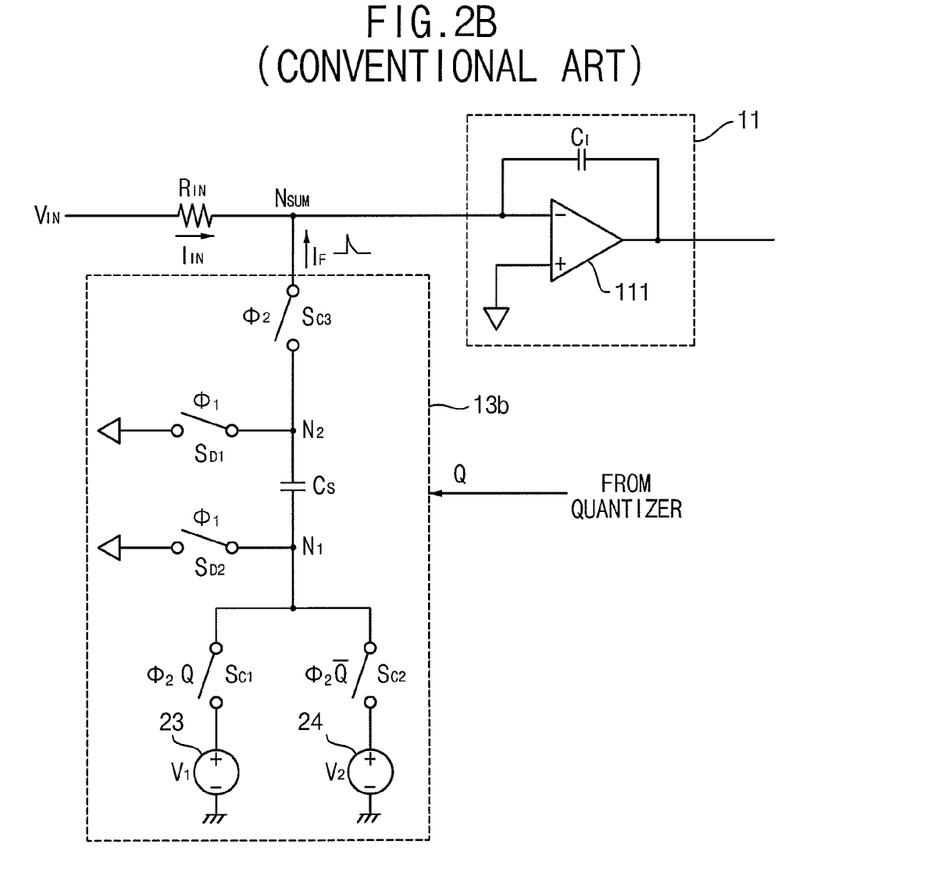

FIG. 2B is a block diagram illustrating the input part of the CTDSM in FIG. 1, in which the feedback DAC 13 in FIG. 1 is implemented with the SC-DAC 13b.

Referring to FIG. 2B, first, second, and third charging switches $S_{C1}$, $S_{C2}$ and $S_{C3}$, and first and second discharging switches $S_{D1}$ and $S_{D2}$ are connected to first and second terminals of a switched capacitor $C_S$. The first and the second charging switches $S_{C1}$ and $S_{C2}$ respectively connect first and second voltage sources 23 and 24 to the switched capacitor $C_S$, and the third charging switch $S_{C3}$ connects the switched capacitor $C_S$ to the summing node $N_{SUM}$. The first and second discharging switches $S_{D1}$ and $S_{D2}$ are turned on in response to a first control signal $\phi 1$. The first charging switch $S_{C1}$ or the second charging switch $S_{C2}$ and the third charging switch $S_{C3}$ are turned on in response to a second control signal $\phi 2$ according to the digital output Q, and the first voltage source 23 or the second voltage source 24 is connected to the summing node $N_{SUM}$ through the switched capacitor $C_S$. When the first voltage source 23 or the second voltage source 24 is connected to the switched capacitor $C_S$ in response to the second control signal $\phi 2$, the switched capacitor $C_S$ is rapidly charged. Therefore, an impulse type current occurs in the initial charging operation.

The total amount of charges delivered to the integration capacitor $C_I$ is the same in both cases of FIGS. 2A and 2B, because an amount of charge corresponding to the digital output Q is delivered in both cases of FIGS. 2A and 2B.

Figure 2C:
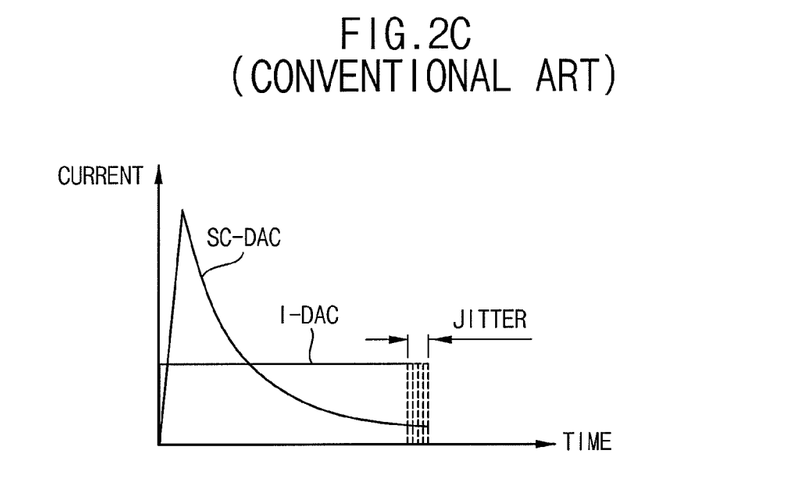
FIG. 2C is a graph illustrating current variations with respect to time in the I-DAC of FIG. 2A and the SC-DAC of FIG. 2B.

FIG. 2C is a graph illustrating current variations with respect to time in the I-DAC of FIG. 2A and in the SC-DAC of FIG. 2B. Referring to FIG. 2C, the current of the I-DAC is relatively small and constant, while the current of the SC-DAC reaches its peak value initially and drops suddenly to reach its final value that is even smaller.

Because the current of the DAC 13 (I-DAC 13a or SC-DAC 13b) is applied to the integrator 111, the current of the DAC has a close relation with the current driving capability of the operational amplifier 111 included in the integrator 11. In the case of the I-DAC, a relatively small constant current is provided and, thus, the operational amplifier may have a low current driving capability and consumes a small amount of power in a real implementation. In the case of the SC-DAC, however, a large current is provided initially and, thus, the operational amplifier may have a large current driving capability and consumes a large amount power in a real implementation.

Noise, such as jitter, may occur in a clock signal for controlling the switches. In the case of the I-DAC 13a, constant current is provided at the latter part of the cycle of the digital output and, thus, positive charges proportional to the jitter are provided to increase an error due to the noise. On the other hand, in the case of the SC-DAC 13b, a very small current is provided at the latter part of the cycle of the digital output and, thus, the error may be insignificant despite the jitter.

As described above, when the feedback DAC 13 is implemented with the conventional the I-DAC 13a or the SC-DAC 13b, the CTDSM 10 is sensitive to jitter in the case of employing the I-DAC 13a for reducing power consumption, or the CTDSM consumes a large power in the case of employing the SC-DAC 13b that is robust to jitter.

For solving these problems, architecture that employs the SC-DAC and inserts a resistor between the switched capacitor and the summing node has been proposed. The proposed architecture, however, restricts not only the initial increasing of current but also the final decreasing of current and, thus, the CTDSM becomes sensitive to jitter.

SUMMARY OF THE INVENTION

Accordingly, exemplary embodiments of the present invention are provided to substantially obviate one or more problems due to limitations and disadvantages of the related art.

Some exemplary embodiments of the present invention provide a self cut-off current source and a current digital-to-analog converter (I-DAC) using the self cut-off current source.

Exemplary embodiments of the present invention provide a continuous time delta-sigma modulator (CTDSM) including a self cut-off I-DAC.

Some exemplary embodiments of the present invention provide an electronic circuit including a self cut-off I-DAC in a feedback loop.

In exemplary embodiments of the present invention, an electronic circuit includes a DAC and an active integrator. The DAC converts a digital output to an analog signal and feeds back the analog signal. The active integrator includes an operational amplifier having a first input terminal that receives a summed signal of an input signal and the analog feedback signal, and a second input terminal that receives a reference voltage. The DAC includes a coupling capacitor, first switches, at least one current source, second switches, and a third switch. The first switches respectively connect first and second terminals of the coupling capacitor to the reference voltage, in response to a first control signal. The at least one current source generates a current that is constant when a voltage difference of two terminals of the current source is greater than a reference value. The current decreases when the voltage difference of the two terminals is smaller than the reference value. The second switches selectively connect the second terminal of the coupling capacitor to the current source, in response to a second control signal and the digital output. The second control signal has a non-overlapping active period with respect to the first control signal. The third switch connects the first terminal of the coupling capacitor to the first input terminal of the operational amplifier, in response to the second control signal.

In exemplary embodiments, the current source may generate the current such that a first time point when the voltage difference is smaller than the reference value is earlier than a second time point when the second control signal is deactivated.

In exemplary embodiments, the current source may include a metal oxide semiconductor (MOS) transistor that is biased by a gate-source voltage equal to or greater than a threshold voltage, and the current is generated based on a drain current of the MOS transistor. The voltage difference may correspond to a drain-source voltage of the MOS transistor.

In some exemplary embodiments, the electronic circuit may further include an input resistor that connects the input signal and the first input terminal of the operational amplifier.

In exemplary embodiments, the input signal and the analog feedback signal may correspond to a differential signal.

Exemplary embodiments of the present invention provide an electronic circuit that includes a coupling capacitor, first switches, at least one current source, second switches, an operational amplifier and a third switch. The first switches respectively connect first and second terminals of the coupling capacitor to a reference voltage, in response to a first control signal. The at least one current source generates a current that is constant when a voltage difference of two terminals of the current source is greater than a reference value, and the current that decreases when the voltage difference of the two terminals is smaller than the reference value. The second switches selectively connect the second terminal of the coupling capacitor to the current source, in response to a second control signal and the digital output, and the second control signal has a non-overlapping active period with respect to the first control signal. The operational amplifier has first and second input terminals and the second input terminal is coupled to the reference voltage. The third switch connects the first terminal of the coupling capacitor to the first input terminal of the operational amplifier, in response to the second control signal.

In exemplary embodiments, the current source may include an MOS transistor that is biased by a gate-source voltage equal to or greater than a threshold voltage, and the current is generated based on a drain current of the MOS transistor. The voltage difference may correspond to a drain-source voltage of the MOS transistor.

In some exemplary embodiments, the electronic circuit may further include an input resistor that connects the input signal and the first input terminal of the operational amplifier.

In exemplary embodiments, the input signal and the analog feedback signal may correspond to a differential signal.

According to exemplary embodiments of the present invention, a CTDSM includes an active integrator, a quantizer and a digital-to-analog converter (DAC). The active integrator includes an operational amplifier having a first input terminal that receives a summed signal of an input signal and an analog feedback signal, and a second input terminal that receives a reference voltage. The quantizer generates a digital output based on an output of the active integrator. The DAC converts the digital output to the analog feedback signal. The DAC includes a coupling capacitor, first switches, at least one current source, second switches, and a third switch. The first switches respectively connect first and second terminals of the coupling capacitor to the reference voltage, in response to a first control signal. The at least one current source generates a current that is constant when a voltage difference of two terminals of the current source is greater than a reference value, and a current that decreases when the voltage difference of the two terminals is smaller than the reference value. The second switches selectively connect the second terminal of the coupling capacitor to the current source, in response to a second control signal and the digital output, and the second control signal has a non-overlapping active period with respect to the first control signal. The third switch connects a first terminal of the coupling capacitor to the first input terminal of the operational amplifier, in response to the second control signal.

In exemplary embodiments, the current source may include an MOS transistor that is biased by a gate-source voltage equal to or greater than a threshold voltage, and the current is generated based on a drain current of the MOS transistor. The voltage difference may correspond to a drain-source voltage of the MOS transistor.

In some exemplary embodiments, the electronic circuit may further include an input resistor that connects the input signal and the first input terminal of the operational amplifier.

In exemplary embodiments, the input signal and the analog feedback signal may correspond to a differential signal.

Therefore, the CTDSM and the electronic circuit including the CTDSM may have a reduced power consumption.

BRIEF DESCRIPTION OF THE DRAWINGS

Exemplary embodiments of the present invention will be understood in more detail from the following descriptions taken in conjunction with the attached drawings.

DESCRIPTION OF EXEMPLARY EMBODIMENTS

Exemplary embodiments of the present invention now will be described more fully with reference to the accompanying drawings, in which exemplary embodiments of the invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the invention to those of ordinary skill in the art. Like reference numerals refer to like elements throughout this application.

Figure 3:
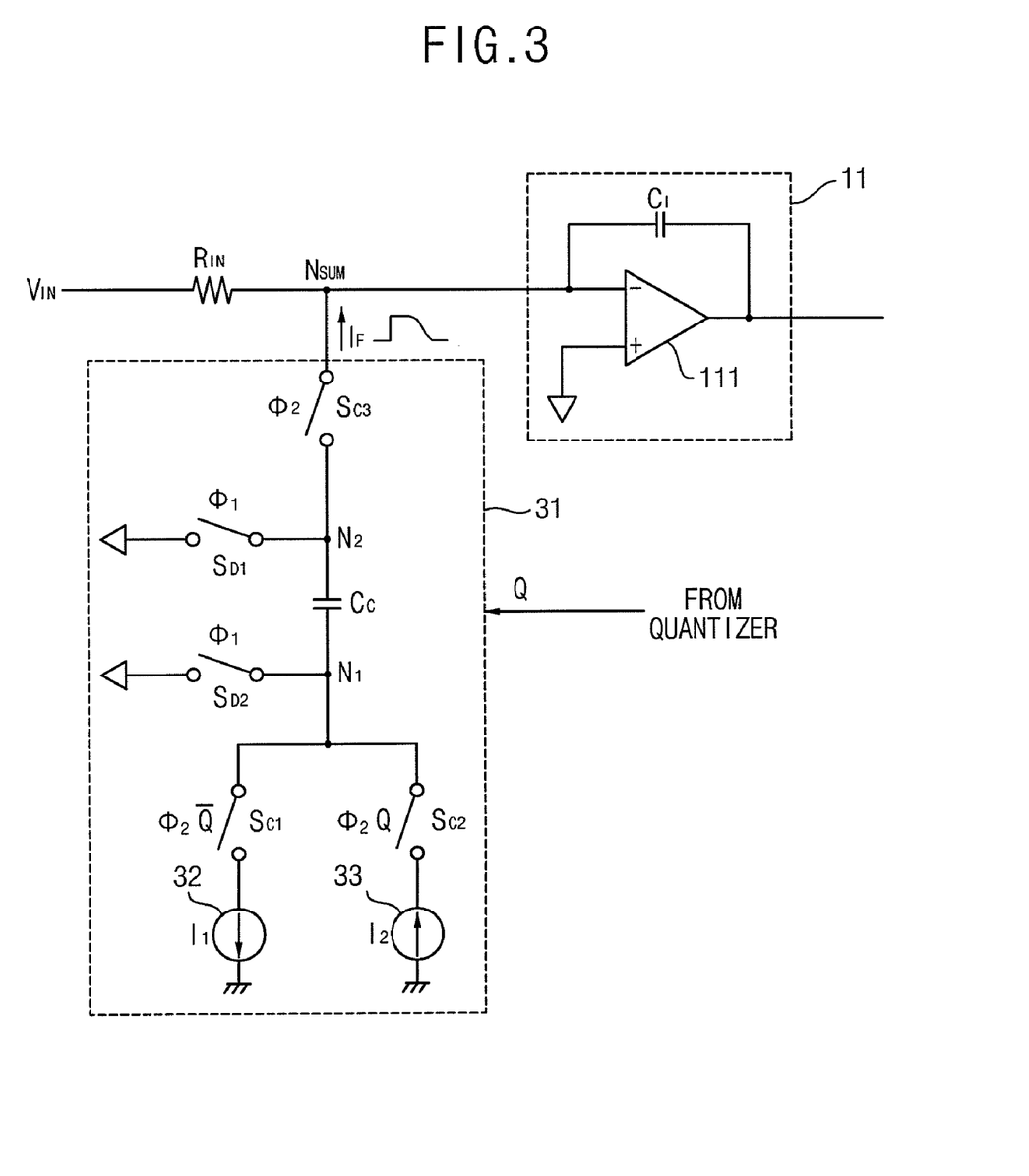
FIG. 3 is a circuit diagram illustrating an input part of a CTDSM including a self cut-off I-DAC according to an exemplary embodiment of the present invention.

FIG. 3 is a circuit diagram illustrating an input part of the continuous time delta-sigma modulator (CTDSM) including a self cut-off current digital-to-analog converter (I-DAC) according to an exemplary embodiment of the present invention.

Referring to FIG. 3, the self cut-off I-DAC 31 may constitute part of a feedback loop of the CTDSM (not illustrated), and provides a feedback current signal $I_F$ to a summing node $N_{SUM}$ according to a digital output Q. Input current $I_{IN}$, corresponding to input signal $V_{IN}$ flowing through an input resistor $R_{IN}$, is summed with the feedback signal $I_F$ at the summing node $N_{SUM}$, and the summed current is integrated in an integration capacitor $C_I$. An active integrator 11 may include the integration capacitor $C_I$ and an operational amplifier 111 such that an input terminal of the operational amplifier 111 is connected to a reference voltage directly or virtually.

For example, the self cut-off I-DAC 31 may be considered as a one-bit DAC for the convenience of explanation. The self cut-off I-DAC 31 may include first and second current sources 32 and 33, first and second discharging switches $S_{D1}$ and $S_{D2}$, first, second, and third charging switches $S_{C1}$, $S_{C2}$ and $S_{C3}$, and a coupling capacitor $C_C$.

The cut-off I-DAC 31 may be constructed such that the coupling capacitor $C_C$ is inserted between the first and second current sources 32 and 33, and the summing node $N_{SUM}$. Although the self cut-off I-DAC 31 appears similar to the SC-DAC in FIG. 2B, the self cut-off I-DAC 31 operates differently from the SC-DAC in FIG. 2B. While the switched capacitor $C_S$ of the SC-DAC shown in FIG. 2B operates as an equivalent resistor by delivering charges based on fast switching, the coupling capacitor $C_C$ in FIG. 3 operates so that voltages of first and second nodes N1 and N2 will be different from each other.

The digital output Q of the CTDSM may be a one-bit or multi-bit digital signal. The first and second current sources 32 and 33 respectively generate first and second currents I1 and I2 corresponding to logic values 'zero' and 'one' of the bits of the digital output Q. The first and second currents I1 and I2 may have the same magnitude but with reverse signs. The first and second current sources 32 and 33 respectively generate the first and second currents I1 and I2 that are constants when voltage differences of two terminals of the first and second current sources 32 and 33 are greater than a reference value. The first and second current sources 32 and 33 respectively generate the first and second currents I1 and I2 that decrease when the voltage differences of the two terminals of the first and second current sources 32 and 33 are smaller than the reference value. By controlling a time duration when the voltage difference of the two terminals of the first and second current sources 32 reaches the reference value, the first and second current sources 32 and 33 can be very robust in being immune to jitter.

The first and second charging switches $S_{C1}$ and $S_{C2}$ respectively connect the first and the second current sources 32 and 33 to the coupling capacitor $C_C$ at the first node N1, and the third charging switch $S_{C3}$ connects the coupling capacitor $C_C$ to the summing node $N_{SUM}$ at the second node N2.

The first and second discharging switches $S_{D1}$ and $S_{D2}$ are turned on in response to a first control signal $\phi 1$ having a first phase, and thus the two terminals of the coupling capacitor $C_C$, that is, the first and second nodes N1 and N2 have the same reference voltage to cause all charges in the coupling capacitor $C_C$ to be discharged. At this time, the third charging switch $S_{C3}$ is turned off in response to a second control signal $\phi 2$ and, thus, the coupling capacitor $C_C$ is electrically disconnected from the summing node $N_{SUM}$ and the first and second current sources 32 and 33. The summing node $N_{SUM}$ is connected to a negative input terminal of the operational amplifier 111 included in the active integrator 11. A positive input terminal of the operational amplifier 111 is connected to the reference voltage, therefore, the summing node $N_{SUM}$ is also at the reference voltage.

After the voltages of the two terminals of the coupling capacitor $C_C$ become the reference voltage, the first charging switch $S_{C1}$ or the second charging switch $S_{C2}$ is turned on or closed and the third charging switch $S_{C3}$ is turned on or closed in response to a second control signal $\phi 2$ having a second phase, thereby to cause the first current source 32 or the second current source 33 to be connected to the summing node $N_{SUM}$ through the coupling capacitor $C_C$. At this time, the first and second discharging switches $S_{D1}$ and $S_{D2}$ are turned off or opened in response to the first control signal φ1.

When the second control signal φ2 is activated, the first current I1 or the second current I2 flows through the first node N1, and thus the voltage of the first node N1 is gradually increased or decreased according to the sign of the flowing current. The voltage of the second node N2 or the summing node $N_{SUM}$ is maintained at the reference voltage, however, because the second node N2 or the summing node $N_{SUM}$ is virtually connected to the reference voltage. When the voltage difference of the two terminals of the first or second current sources 32 or 33 is smaller than the reference value, the first current I1 or the second current I2 decreases. Therefore, when the voltage differences of the first and second current sources 32 and 33 are set to be smaller than a reference value sufficiently before the second control signal φ2 is deactivated, the self cut-off I-DAC 31 may minimize the errors due to jitter in case the is second control signal φ2 has a large jitter.

Right after the second control signal φ2 is applied, the two terminals of the coupling capacitor $C_C$ have the reference voltage. In this case, the first current I1 or the second current I2 is forcibly applied to the coupling capacitor $C_C$ from the first node N1 and, thus, a feedback current $I_F$ corresponding to the first current I1 or the second current I2 from the summing node $N_{SUM}$ flows to the coupling capacitor $C_C$.

The self cut-off I-DAC 31 generates the feedback current $I_F$ having the same magnitude as the first current I1 or the second current I2 and provides the generated feedback current $I_F$ to the summing node $N_{SUM}$. The self cut-off I-DAC 31 may initially provide the feedback current $I_F$ having a constant magnitude, and cuts off the feedback current $I_F$ by itself before the second control signal φ2 is deactivated.

Figure 4A:
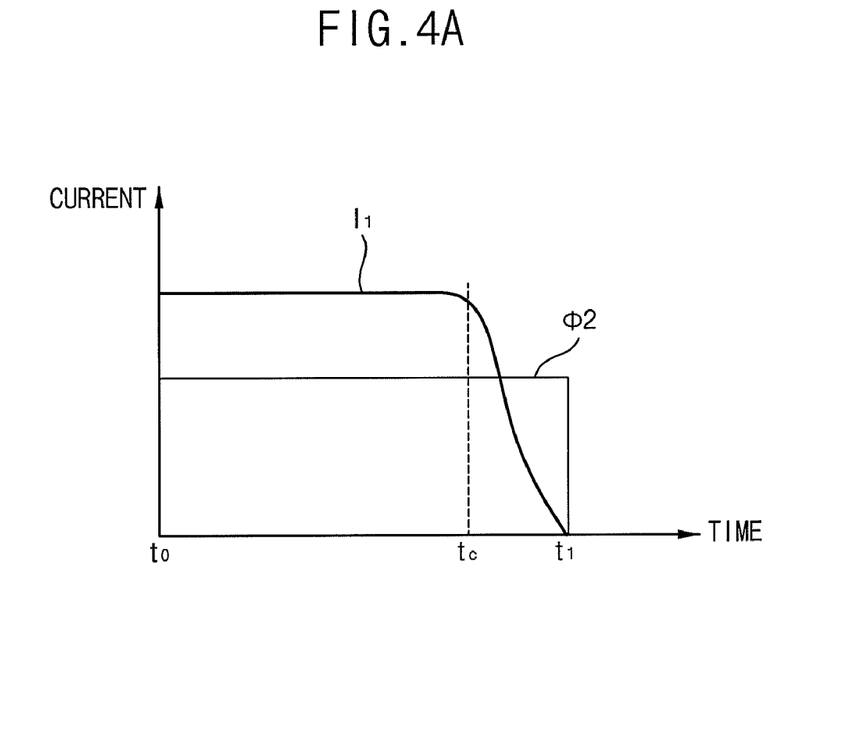
FIG. 4A is a graph illustrating a current characteristic of the self cut-off I-DAC shown in FIG. 3.
Figure 4B:
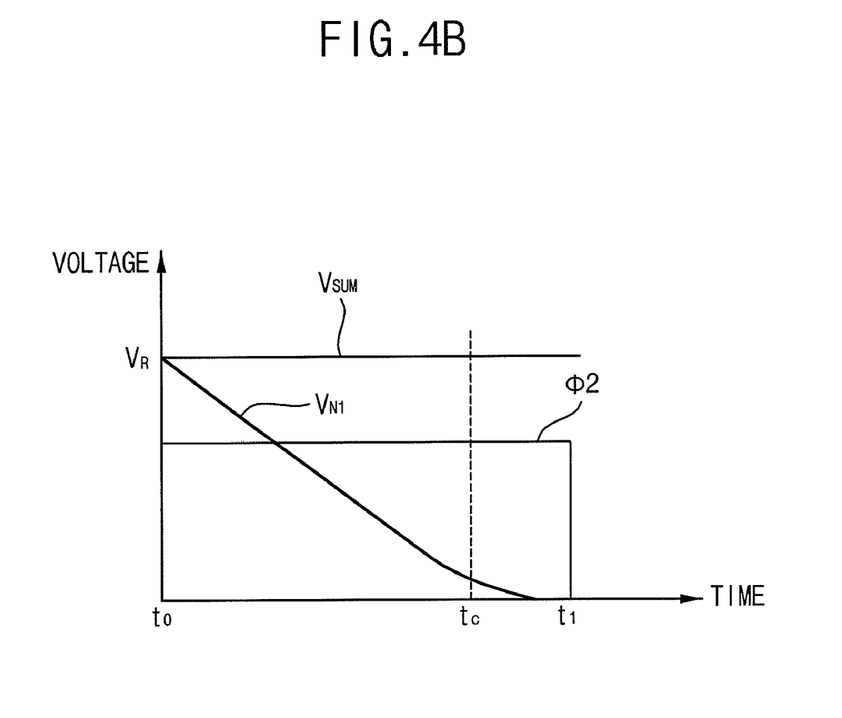
FIG. 4B is a graph illustrating voltages of the summing node and the first node of the CTDSM shown in FIG. 3.

FIG. 4A is a graph illustrating a current characteristic of the self cut-off I-DAC shown in FIG. 3, and FIG. 4B is a graph illustrating voltages of the summing node and the first node in the circuit shown in FIG. 3.

The first current I1 and the second current I2 respectively provided by the first current source 32 and the second current source 33 have different signs, but the first current I1 and the second current I2 have substantially the same characteristics. Therefore, only the first current I1 will be described and repeated descriptions of the second current I2 will be omitted.

Referring to FIG. 4A, relative waveforms of the second control signal φ2 and the first current I1 are illustrated. The second control signal φ2 is activated from a reference time t0 to an ending time t1. The first current I1 is maintained at a constant value during a first interval from the reference time t1 to a cut-off time tc, and dwindles during a second interval from the cut-off time tc to the ending time t1.

The self cut-off I-DAC 31 in FIG. 3 has a construction such that the coupling capacitor CC is further included compared with the conventional I-DAC shown in FIG. 2A, and the feedback current $I_F$ has the same waveform as the first current I1 by the first current source 32 or the second current source 33. That is, the feedback current $I_F$ initially has a constant magnitude and rapidly decreases before the cycle of the second control signal φ2 ends.

In operation of the self cut-off I-DAC 31, the total amount of charges that are delivered is very important. The delivery of charges is initiated at the very moment of the activation of the second control signal φ2 and, thus, the jitter at the starting moment of the second control signal φ2 becomes trivial. In the conventional technique, the jitter at the ending moment of the second control signal φ2 as shown in FIG. 2C, for example, may change the amount of charges that are delivered and, thus, may have great influence on the operation of the I-DAC. When the self cut-off I-DAC in FIG. 3 according to an exemplary embodiment of the present invention is employed, however, the magnitude of the feedback current $I_F$ is very small or substantially zero, and the jitter has little influence on the operation of the self cut-off I-DAC. In addition, the feedback current $I_F$ is applied to the operational amplifier 111 included in the active integrator 11. Therefore, the operational amplifier 111 need not have a large current driving capability.

When the magnitude of feedback current $I_F$ becomes substantially zero before the second control signal φ2 is deactivated by controlling the cut-off time tc, the jitter has no influence on the operation.

Referring to FIG. 4B, the two terminals of the coupling capacitor $C_C$ are connected to the reference voltage at the very moment of the reference time t0, and the first node N1 has the reference voltage $V_R$ at the reference time t1. The summing node $N_{SUM}$ or the second node N2 is connected to the negative input terminal of the operational amplifier 111, and the positive input terminal has the reference voltage $V_R$. Therefore, the summing node $N_{SUM}$ or the second node N2 has the reference voltage $V_R$. After the reference time t1, the voltage $V_{SUM}$ of the summing node $N_{SUM}$ is maintained at the reference voltage $V_R$, while voltage $V_{N1}$ of the first node N1 descends gradually. The voltage $V_{N1}$ of the first node N1 keeps descending, and is lower than a reference value at the cut-off time tc. When the magnitude of the first current I1 decreases after the cut-off time tc, the voltage $V_{N1}$ of the first node N1 descends more slowly than before and approaches zero.

Although not illustrated in FIG. 4B, the voltage $V_{N1}$ of the first node N1 ascends gradually in case of the first current having the reverse sign.

Figure 5:
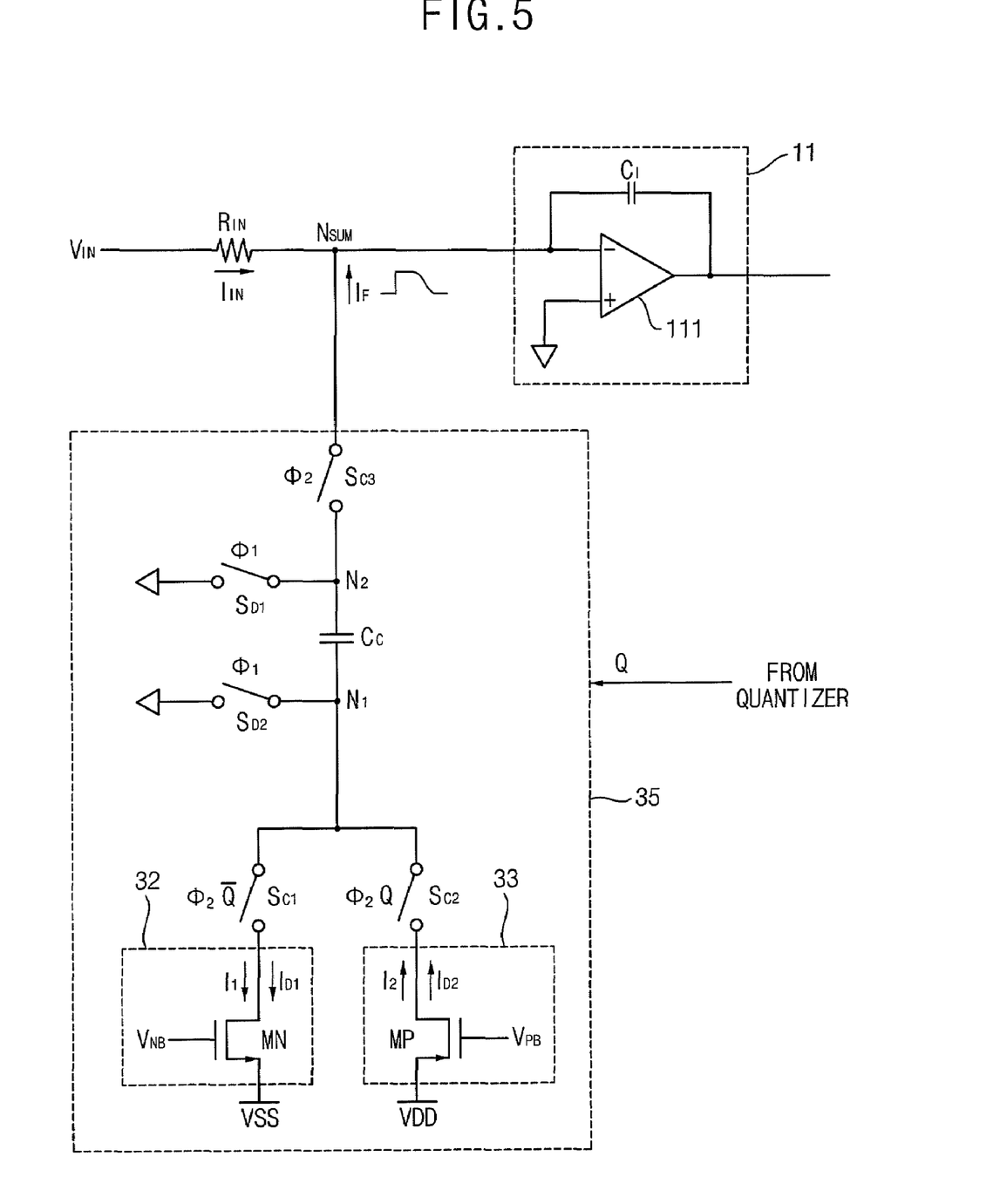
FIG. 5 is a circuit diagram illustrating an input part of a CTDSM including a self cut-off I-DAC according to an exemplary embodiment of the present invention.

FIG. 5 is a circuit diagram illustrating an input part of a continuous time delta-sigma modulator (CTDSM) including a self cut-off I-DAC according to an exemplary embodiment of the present invention.

Referring to FIG. 5, a self cut-off I-DAC 35 constitutes a feedback loop of the CTDSM (not illustrated) just as the self cut-off I-DAC 31 constitutes a feedback loop in the circuit of FIG. 3. The self cut-off I-DAC 35 provides the feedback current $I_F$ to the summing node $N_{SUM}$ according to the digital output Q of the CTDSM. The input current $I_{IN}$ is summed with the feedback current $I_F$ at the summing node $N_{SUM}$, and the summed current is integrated in the integration capacitor $C_1$.

For example, the self cut-off I-DAC 35 may be considered as a one-bit DAC for the convenience of explanation. The self cut-off I-DAC 35 may include first and second current sources 32 and 33, first and second discharging switches $S_{D1}$ and $S_{D2}$, first, second, and third charging switches $S_{C1}$, $S_{C2}$ and $S_{C3}$, and a coupling capacitor $C_C$. The first and second current sources 32 and 33 respectively include first and second transistors MN and MP. When drain currents $I_{D1}$ and $I_{D2}$ of the first and second transistors MN and MP are respectively first and second currents I1 and I2, the first and second currents I1 and I2 respectively correspond to logic 'zero' and logic 'one' of the digital output Q. The first transistor MN may be an n-type metal oxide semiconductor (NMOS) transistor, and the second transistor MP may be a p-type metal oxide semiconductor (PMOS) transistor. The first and second transistors MN and MP are respectively biased by gate-source voltages $V_{NB}$ and $V_{PB}$ enough for turning on the first and second transistors MN and MP. The high power-supply voltage VDD is higher than the reference voltage, and the low power-supply voltage VSS is lower than the reference voltage.

As described with reference to FIG. 3, the first and second discharging switches $S_{D1}$ and $S_{D2}$ are turned on in response to a first control signal $\phi1$ having a first phase and, thus, two terminals of the coupling capacitor $C_C$, that is, the first and second nodes N1 and N2 have the same reference voltage, thereby to cause all charges charged in the coupling capacitor $C_C$ to be discharged. The summing node $N_{SUM}$ has the reference voltage. The reference voltage has a magnitude sufficient for operating an MOS transistor, that is, the first transistor MN or the second transistor MP, in a saturation mode. At this time, the third charging switch $S_{C3}$ is turned off or opened in response to a second control signal $\phi2$ and, thus, the coupling capacitor $C_C$ is electrically disconnected from the summing node $N_{SUM}$ and the first and second current sources 32 and 33.

After the voltages of the two terminals of the coupling capacitor $C_C$ become the reference voltage, the first charging switch $S_{C1}$ or the second charging switch $S_{C2}$ is turned on and the third charging switch $S_{C3}$ is turned on in response to a second control signal $\phi2$ having a second phase to cause the first current source 32 or the second current source 33 to be connected to the summing node $N_{SUM}$ through the coupling capacitor $C_C$. At this time, the first and second discharging switches $S_{D1}$ and $S_{D2}$ are turned off in response to the first control signal $\phi1$.

When the digital output Q corresponds to logic 'zero', the first transistor MN is connected to the coupling capacitor $C_C$ by the first charging switch $S_{C1}$. The bias voltage $V_{NB}$ is applied to gate of the first transistor MN, and thus the first transistor MN is turned on. A drain of the first transistor MN is connected to the first node N1 having the reference voltage, and thus a voltage of the drain of the first transistor MN is sufficient for operating the first transistor MN in a saturation mode. Therefore, the drain current $I_{D1}$ is generated at the drain of the first transistor MN, and a magnitude of the drain current $I_{D1}$ is determined by the bias voltage $V_{NB}$. The voltage of the first node N1 linearly decreases from the reference voltage. When the voltage of the first node N1 drops below a reference value, or the drain-source voltage of the first transistor MN drops below the reference value, the first transistor MN operates in a triode mode, and thus the drain current $I_{D1}$ begins to decrease. Because the voltage of the first node N1 keeps dropping, the drain current $I_{D1}$ substantially approaches zero. Therefore, the self cut-off I-DAC 35 cuts off the feedback current $I_F$ by itself.

When the digital output Q corresponds to logic 'one', the second transistor MP is connected to the coupling capacitor $C_C$ by the second charging switch $S_{C2}$. The bias voltage $V_{PB}$ is applied to the gate of the second transistor MP, and thus the second transistor MP is turned on. A drain of the second transistor MP is connected to the first node N1 having the reference voltage, and thus a voltage of the drain of the second transistor MP is sufficient for operating the first transistor MP in a saturation mode. Therefore, the drain current $I_{D2}$ is generated at the drain of the second transistor MP, and a magnitude of the drain current $I_{D2}$ is determined by the bias voltage $V_{PB}$. The voltage of the first node N1 linearly increases from the reference voltage. When the source-drain voltage of the second transistor MP drops below a reference value, the second transistor MN operates in a triode mode, and thus the drain current $I_{D2}$ begins to decrease and is cut off.

The drain currents $I_{D1}$ and $I_{D2}$ of the first and second transistors MN and MP, respectively, charge or discharge the coupling capacitor $C_C$. The feedback current $I_F$ having the same magnitude as the drain current is generated from the summing node $N_{SUM}$ to the coupling capacitor $C_C$ based on the law of conservation of charge.

Although a one-bit DAC is taken for an example with reference to FIGS. 3 and 5, exemplary embodiments of the present invention are also applicable to a multi-bit DAC when a multi-bit quantizer is used. In addition, exemplary embodiments of the present invention are also applicable when the input and output signals are differential signals, as well as single-ended signals. Furthermore, exemplary embodiments of the present invention are also applicable, when the current sources are implemented with well-biased bipolar junction transistors.

Exemplary embodiments of the present invention are applicable to electronic circuits including a DAC that converts a digital output to an analog signal and feeds back the analog signal. More specifically, exemplary embodiments of the present invention are applicable to electronic circuits that apply the analog signal to the input stage of an active filter using an operational amplifier. Exemplary embodiments of the present invention are applicable to electronic circuits that include a DAC and an operational amplifier and that receive an analog signal converted from a digital signal by using the operational amplifier and also to electronic circuits that require a self cut-off current source.

When exemplary embodiments of the present invention are implemented by using present semiconductor process techniques, the cut-off time of the current source may be varied according to size variances of the current source or the coupling capacitor caused by the errors generated in the process to change the amount of charges delivered from the DAC. Generally, DACs with high precision or filters include self-calibration circuits or auto-tuning circuits for compensating the errors generated in the manufacturing process. Exemplary embodiments of the present invention may further include self-calibration circuits or auto-tuning circuits for compensating errors generated in the manufacturing process.

As described above, the self cut-off I-DAC and the electronic circuit including the self cut-off I-DAC in the feedback loop according to exemplary embodiments of the present invention are robust to jitter and reduce the requirements of the current driving capability. Therefore, the self cut-off I-DAC and the electronic circuit including the self cut-off I-DAC in the feedback loop may reduce overall design burden and power consumption.

While exemplary embodiments of the present invention and their advantages have been described in detail, it should be understood that various changes, substitutions and alterations may be made herein without departing from the scope of the invention.

What is claimed is:

1. An electronic circuit comprising:
    an active integrator including an operational amplifier, the operational amplifier having a first input terminal that receives a summed signal of an input signal and an analog feedback signal, and a second input terminal that receives a reference voltage; and
    a digital to analog converter (DAC) that converts a digital output of the electronic circuit to an analog signal and provides the analog feedback signal, the DAC comprising:
        a coupling capacitor;
        first switches that respectively connect first and second terminals of the coupling capacitor to the reference voltage, in response to a first control signal;
        at least one current source that generates a current, the current being constant when a voltage difference of two terminals of the current source is greater than a reference value, and the current decreasing when the voltage difference of the two terminals is smaller than the reference value;

second switches that selectively connect the second terminal of the coupling capacitor to the current source, in response to a second control signal and the digital output, the second control signal having a non overlapping active period with respect to the first control signal; and a third switch that connects the first terminal of the coupling capacitor to the first input terminal of the operational amplifier, in response to the second control signal, the current source generating the current such that a first time point when the voltage difference is smaller than the reference value is earlier than a second time point when the second control signal is deactivated.

2. The electronic circuit of claim 1, wherein the current source comprises a metal oxide semiconductor (MOS) transistor that is biased by a gate-source voltage equal to or greater than a threshold voltage, and the current is generated based on a drain current of the MOS transistor.

3. The electronic circuit of claim 2, wherein the voltage difference corresponds to a drain-source voltage of the MOS transistor.

4. The electronic circuit of claim 1, further comprising an input resistor that connects the input signal and the first input terminal of the operational amplifier.

5. The electronic circuit of claim 1, wherein the input signal and the analog feedback signal correspond to a difference signal.

6. The electronic circuit of claim 1, further comprising a self-calibration circuit that compensates errors generated in a manufacturing process of the current source.

7. The electronic circuit of claim 1, further comprising an auto-tuning circuit that compensates errors generated in a manufacturing process of the coupling capacitor.

8. An electronic circuit comprising:
a coupling capacitor;
first switches that respectively connect first and second terminals of the coupling capacitor to a reference voltage, in response to a first control signal;
at least one current source that generates a current, the current being constant when a voltage difference of two terminals of the current source is greater than a reference value, and the current decreasing when the voltage difference of the two terminals is smaller than the reference value;
second switches that selectively connect the second terminal of the coupling capacitor to the current source, in response to a second control signal and the digital output of the electronic circuit, the second control signal having a non-overlapping active period with respect to the first control signal;
an operational amplifier having first and second input terminals, the second input terminal being coupled to the reference voltage; and
a third switch that connects the first terminal of the coupling capacitor to the first input terminal of the operational amplifier, in response to the second control signal,
the current source generating the current such that a first time point when the voltage difference is smaller than the reference value is earlier than a second time point when the second control signal is deactivated.

9. The electronic circuit of claim 8, wherein the current source comprises a metal oxide semiconductor (MOS) transistor that is biased by a gate-source voltage equal to or greater than a threshold voltage, and the current is generated based on a drain current of the MOS transistor.

10. The electronic circuit of claim 9, wherein the voltage difference corresponds to a drain-source voltage of the MOS transistor.

11. The electronic circuit of claim 8, further comprising an input resistor that connects the input signal and the first input terminal of the operational amplifier.

12. The electronic circuit of claim 8, wherein the input signal and the analog feedback signal correspond to a difference signal.

13. The electronic circuit of claim 8, further comprising a self-calibration circuit that compensates errors generated in a manufacturing process of the current source.

14. The electronic circuit of claim 8, further comprising an auto-tuning circuit that compensates errors generated in a manufacturing process of the coupling capacitor.

15. A continuous time delta sigma modulator (CTDSM) comprising:
an active integrator including an operational amplifier, the operational amplifier having a first input terminal that receives a summed signal of an input signal and an analog feedback signal, and a second input terminal that receives a reference voltage;
a quantizer that generates a digital output based on an output of the active integrator; and
a digital to analog converter (DAC) that converts the digital output to the analog feedback signal, the DAC comprising:
a coupling capacitor;
first switches that respectively connect first and second terminals of the coupling capacitor to the reference voltage, in response to a first control signal;
at least one current source that generates a current, the current being constant when a voltage difference of two terminals of the current source is greater than a reference value, and the current decreasing when the voltage difference of the two terminals is smaller than the reference value;
second switches that selectively connect the second terminal of the coupling capacitor to the current source, in response to a second control signal and the digital output, the second control signal having a non overlapping active period with respect to the first control signal; and
a third switch that connects the first terminal of the coupling capacitor to the first input terminal of the operational amplifier, in response to the second control signal,
the current source generating the current such that a first time point when the voltage difference is smaller than the reference value is earlier than a second time point when the second control signal is deactivated.

16. The CTDSM of claim 15, wherein the current source comprises a metal oxide semiconductor (MOS) transistor that is biased by a gate-source voltage equal to or greater than a threshold voltage, and the current is generated based on a drain current of the MOS transistor.

17. The CTDSM of claim 16, wherein the voltage difference corresponds to a drain-source voltage of the MOS transistor.

18. The CTDSM of claim 15, further comprising an input resistor that connects the input signal and the first input terminal of the operational amplifier.

19. The CTDSM of claim 15, wherein the input signal and the analog feedback signal correspond to a difference signal.

20. The CTDSM of claim 15, further comprising a self-calibration circuit that compensates errors generated in a manufacturing process of the current source.

21. The CTDSM of claim 15, further comprising an auto-tuning circuit that compensates errors generated in a manufacturing process of the coupling capacitor.

* * * * *